METHOD OF PRODUCING LOW-CAPACITANCE BARRIER LAYERS IN SEMI-CONDUCTOR BODIES
Filed Dec. 29, 1959
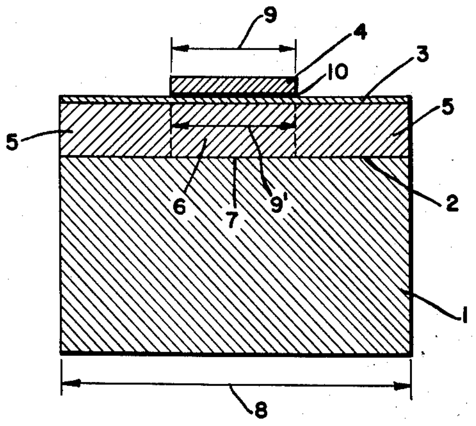
INVENTORS
Gerhard Grust &
Reinhold Kaiser
BY George H Spencer
ATTORNEY United States Patent Office 3,116,174

Patented Dec. 31, 1963

3,116,174

METHOD OF PRODUCING LOW-CAPACITANCE BARRIER LAYERS IN SEMI-CONDUCTOR BODIES

Gerhard Grust and Reinhold Kaiser, Ulm (Danube), Germany, assignors to Telefunken G.m.b.H., Berlin, Germany Filed Dec. 29, 1959, Ser. No. 862,560
Claims priority, application Germany Jan. 3, 1959
4 Claims. (Cl. 148—1.5)

This invention relates to a method of producing a semiconductor device having definite junction capacitances, and particularly to a method to be used on a semiconductor already provided with a barrier layer, particularly a pn junction inside thereof.

The problem of reducing the extent of pn junctions within semiconductor bodies is encountered usually in connection with making those kinds of semiconductor devices in which the pn junction is produced either by doping the fluid semiconductive material out of which the crystal has been grown or by means of diffusion or alloying of impurity material, so-called donors or accepters, into the surface of the already crystallized semiconductor body. In order to keep the pn junction capacitance of, for example, diffusion-junction diodes small and of a definite magnitude, the extent of the pn junction has to be reduced to a definite size, because the junction initially extends substantially through the entire semiconductor body, possibly with an indefinite boundary.

It is an object of the invention to provide a novel and improved method of reducing the size of barrier layers particularly of pn junctions, inside a semiconductor body.

It is another object of the invention to provide a low-input resistance-low-junction capacitance semiconductor barrier layer diode.

According to one aspect of the invention the method is applied to a semiconductor body already containing a pn junction, and then to deposit or otherwise mount a contact wafer on the semi-conductor body parallel with the barrier layer. The wafer is made of such a size that it is coextensive with the final size desired for the barrier layer. The wafer must be made of material which is not attacked by the etching compound but is resistive thereagainst. Further, the wafer material must be of such kind as not to produce, itself, a barrier layer in the semiconductor body. Thereafter the semiconductor assembly must be etched until those portions of the semiconductor material above the barrier layer and not covered by the wafer are removed. The shape and area of the barrier layer still present after etching corresponds substantially to the size of the wafer, provided the wafer, and especially its edges were not attacked by the etching compound.

The inventive method makes use of the fact that the removal of semiconductor material by etching is carried out only on the material positioned around the contact wafer whereby the semi-conductor material between the wafer and the junction substantially remains unattacked. Thus, the semiconductor body remains within the etching fluid until the undesired rectifier layers around the wafer are removed.

Still further objects and the entire scope of applicability of the present invention will become apparent from the detailed description given hereinafter; it should be understood, however, that the detailed description and specific examples, while indicating preferred embodiments of the invention, are given by way of illustration only, since various changes and modifications within the spirit and scope of the invention will become apparent to those skilled in the art from this detailed description.

The FIGURE of the drawing is a cross-sectional view of a silicon diffusion diode prepared for treatment according to the inventive method.

A semiconductor body 1, in this case basically consisting of n-type silicon in its lower portion, has a barrier layer in the form of a pn junction 2 produced by diffusion of accepter impurities into the initial n-type silicon, which impurities produce p-type conductivity terminating at the barrier layer 2. It is understood, however, that the barrier layer may have also been produced by doping during the growth of the crystal of which body 1 is a part, before the cutting or sawing of the crystal. Thus, any mode of producing a barrier layer in a semiconductor crystal is suitable for the purpose of the invention.

Preferably the semiconductor silicon body 1 initially has impurities of antimony, of a concentration less than .1%, and the p-type conductivity above the junction 2 was produced by adding indium either by diffusion or by doping during crystal growth. Small junction capacitances require barrier layers of small area, i.e. of small lateral extent. In spite of this requirement it is not possible to initially make the dimension 8 of the body 1 as small as required for the desired area of the barrier layer. This is due to the fact that this area or lateral extension is so small that the dimensional tolerances during production of the semi-conductor body cannot be insured.

Furthermore, the electrical input resistance of the diodes is to be small, which characteristic usually corresponds to a large cross-sectional area. Thus, low capacity and low input resistance for a pn junction diode are mutually opposed requirements, and they can both be fulfilled only when the cross-section of the semiconductor body is tapered at and near the barrier layer. The inventive method provides such a result when the surface of the silicon body is nickel-coated as at 3, to which layer a platinum wafer 4 is bonded. The nickel layer serves to avoid the creating of another barrier layer directly below the wafer 4. Thus, wafer 4 makes non-rectifying, low resistance contact with the semiconductor body 1 above the pn junction 2. The area of wafer 4 denoted by 9 is to be of such extent that it corresponds substantially to the extent 9′ of the desired area for the barrier layer. In order to avoid any mechanical stresses the platinum wafer is soldered to the nickel layer 3 by means of soft solder 10, for example tin. After these steps have been completed, the semiconductor device is then defined by the outer boundary lines shown in the drawing. This entire device, i.e. the thus-prepared body, is then dipped into an etching fluid, for example nitric acid+hydrofluoric acid. It remains therein until the undesired portions of semiconductive material above the barrier layer 2 are removed. These portions are denoted by 5. The platinum wafer 4 is not attacked by the etching fluid. Thus, the semiconductor material in the rectangle denoted by 6 remains untouched or, in other words, the junction portion 7 below the wafer remains undisturbed by the etching. Junction portion 7 thereby obtains a final cross-sectional dimension 9′ which substantially equals dimension 9 of the wafer 4.

It will be appreciated, of course, that the drawing is not to scale and that the dimensions in the vertical direction are greatly exaggerated for the sake of emphasis. Furthermore, the etching may remove material not only precisely to, but somewhat below, junction 2 because the main purpose of the entire method is the removal of undesired barrier layer portions.

The inventive method makes it possible that any particular shape and area of barrier layer can be produced solely by making the wafer of the shape of the desired junction surface, wherein the wafer is made of a material not attacked by the etching fluid. The undesired portions of the junction surface are then removed by etching. It will be appreciated that one also can employ the method according to the invention on semiconductor devices other than silicon diodes. In the case of transistors, for example, one would have such a wafer contact arrangement on opposite sides of a semiconductor body having two junctions. Those portions of the junctions which are not below the adjoining wafer will be removed by etching and those portions below the adjoining wafer will remain if the wafers are made of etch-resistive material.

We claim:

1. The method of producing semiconductor junction devices having uniform junction capacities, comprising the steps of producing a semiconductor body having a barrier layer forming a junction, depositing a nickel layer on the surface of said body parallel with said junction, securing a contact wafer of etch-resistant material on the nickel layer so that the formation of a further barrier layer directly below said wafer is avoided, the area of said wafer being smaller than the area of the barrier layer, and etching away those portions of the layer remaining uncovered by said wafer.

2. The method of producing a silicon junction device having low junction capacity, comprising the steps of producing a silicon body having a barrier layer of the pn junction type, depositing a nickel layer on the surface of said body parallel with said junction, soldering an etch-resistant wafer of area smaller than the area of said metallic layer on said metallic layer, and removing by chemical action the portions of said metallic layer and said barrier layer which remain uncovered by said wafer, whereby the formation of a barrier layer directly below said wafer is avoided.

3. The method of producing a silicon junction device having low junction capacity and low input resistance, comprising the steps of producing a silicon diode having a barrier layer with a junction surface therein, depositing a nickel layer on said diode parallel with said surface, soldering a platinum wafer smaller than the area of said junction surface on said nickel layer, and removing from said diode the portions of the nickel and the silicon layer remaining uncovered by said platinum wafer.

4. A low resistance, low junction capacity diode, comprising a contact wafer; a first layer of semiconductor material of one conductivity type adjacent to and bonded with said wafer and of area coextensive therewith, there being interposed between said wafer and said first layer a nickel layer which prevents the formation of a barrier layer between said wafer and said first layer; a second layer of semiconductor material of opposite conductivity type forming a pn junction with said first layer and of area larger than the first layer, and all of said semiconductor material being of single-crystal structure.

References Cited in the file of this patent

UNITED STATES PATENTS

| | | |
|---|---|---|
| 2,794,846 | Fuller | June 4, 1957 |
| 2,878,147 | Beale | Mar. 17, 1959 |
| 2,911,706 | Wertwijn | Nov. 10, 1959 |
| 2,930,722 | Ligenza | Mar. 29, 1960 |
| 2,964,689 | Buschert et al. | Dec. 13, 1960 |